United States Patent
Kang

(10) Patent No.: US 9,058,900 B2
(45) Date of Patent: Jun. 16, 2015

(54) SYSTEM, SEMICONDUCTOR MEMORY DEVICE AND OPERATING METHOD THEREOF

(75) Inventor: Won Kyung Kang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 662 days.

(21) Appl. No.: 13/341,283

(22) Filed: Dec. 30, 2011

(65) Prior Publication Data

US 2013/0077399 A1  Mar. 28, 2013

(30) Foreign Application Priority Data

Sep. 26, 2011  (KR) .................. 10-2011-0096808

(51) Int. Cl.
  G11C 16/06   (2006.01)
  G11C 11/56   (2006.01)
  G11C 16/04   (2006.01)
  G11C 16/34   (2006.01)

(52) U.S. Cl.
  CPC ........ *G11C 11/5635* (2013.01); *G11C 16/0483* (2013.01); *G11C 16/349* (2013.01); *G11C 2211/5646* (2013.01); *G11C 2211/5644* (2013.01)

(58) Field of Classification Search
None
See application file for complete search history.

(56) References Cited

U.S. PATENT DOCUMENTS

| 2005/0099870 | A1* | 5/2005 | Chen et al. .................. 365/222 |
| 2007/0133291 | A1* | 6/2007 | Fukuda et al. ............ 365/185.17 |
| 2009/0067257 | A1* | 3/2009 | Lee et al. .................. 365/185.33 |
| 2009/0262576 | A1* | 10/2009 | Moon et al. ................. 365/185.2 |
| 2010/0046293 | A1* | 2/2010 | Won .......................... 365/185.11 |

FOREIGN PATENT DOCUMENTS

KR   1020110060493 A   6/2011

* cited by examiner

*Primary Examiner* — Son Dinh
*Assistant Examiner* — Uyen B Tran
(74) *Attorney, Agent, or Firm* — William Park & Associates Ltd.

(57) ABSTRACT

A method for operating a semiconductor memory device including a memory block constituted by first memory cells used as main memory cells and second memory cells includes reading out an erase count of the memory block stored in the second memory cells, erasing the memory block, increasing the read-out erase count, and storing the increased erase count in the second memory cells.

16 Claims, 6 Drawing Sheets

SYSTEM, SEMICONDUCTOR MEMORY DEVICE AND OPERATING METHOD THEREOF

CROSS-REFERENCES TO RELATED APPLICATION

The present application claims priority under 35 U.S.C. §119(a) to Korean application number 10-2011-0096808, filed on Sep. 26, 2011, in the Korean Intellectual Property Office, which is incorporated herein by reference in its entirety.

BACKGROUND

1. Technical Field

The present invention relates generally to a nonvolatile memory device, and more particularly, to a nonvolatile memory device which manages an erase count and an operating method is thereof.

2. Related Art

Semiconductor memory devices are generally divided into a volatile memory device and a nonvolatile memory device. While the volatile memory device requires power supply to retain stored data, the nonvolatile memory device can retain stored data even in absence of power supply. Nonvolatile memory devices include various types of memory cell transistors. Nonvolatile memory devices are divided into a flash memory device, a ferroelectric RAM (FRAM), a magnetic RAM (MRAM), a phase change RAM (PRAM), etc.

Among nonvolatile memory devices, flash memory devices are generally divided into a NOR flash memory device and a NAND flash memory device, depending upon a configuration of memory cells and a bit line. The NOR flash memory device has a configuration in which two or more memory cell transistors are connected in parallel to one bit line. Accordingly, the NOR flash memory device has an excellent characteristic in terms of random access time. Conversely, the NAND flash memory device has a structure in which two or more memory cell transistors are connected in series to one bit line. This configuration is referred to as a cell string structure, and one bit line contact is needed per a cell string. Therefore, the NAND flash memory device has an excellent characteristic in terms of the degree of integration.

A memory system including a flash memory device may is uniformly manage the wear levels of the pages or blocks of the flash memory device so that the flash memory device can be used with reliability for a long time. That is, the memory system may manage the wear levels of the pages or blocks of the flash memory device so that the data is distributed evenly across the memory cells even if a user repeatedly writes data to the same logical sector, and this is referred to as a wear leveling technique. In using the wear leveling technique, the memory system may manage an erase count for each of the blocks of the flash memory device. The memory system may manage the erase count through a working memory, and may also back up the erase count to the flash memory device.

SUMMARY

A nonvolatile memory device capable of efficiently administrating an erase count and a method for operating the same are described herein.

In one embodiment of the present invention, a method for operating a nonvolatile memory device including a memory block constituted by main memory cells and dummy memory cells includes: reading out an erase count of the memory block stored in the dummy memory cells, erasing the memory block, increasing the read-out erase count, and storing the increased erase count in the dummy memory cells.

In another embodiment of the present invention, a is nonvolatile memory device includes: a memory block including main memory cells and dummy memory cells; and a control logic configured to control an erase operation of the memory block, wherein the control logic reads out an erase count of the memory block stored in the dummy memory cells, erases the memory block, increases the read-out erase count, and stores the increased erase count to the dummy memory cells.

BRIEF DESCRIPTION OF THE DRAWINGS

Features, aspects, and embodiments are described in conjunction with the attached drawings, in which.

DETAILED DESCRIPTION

Figure 1:
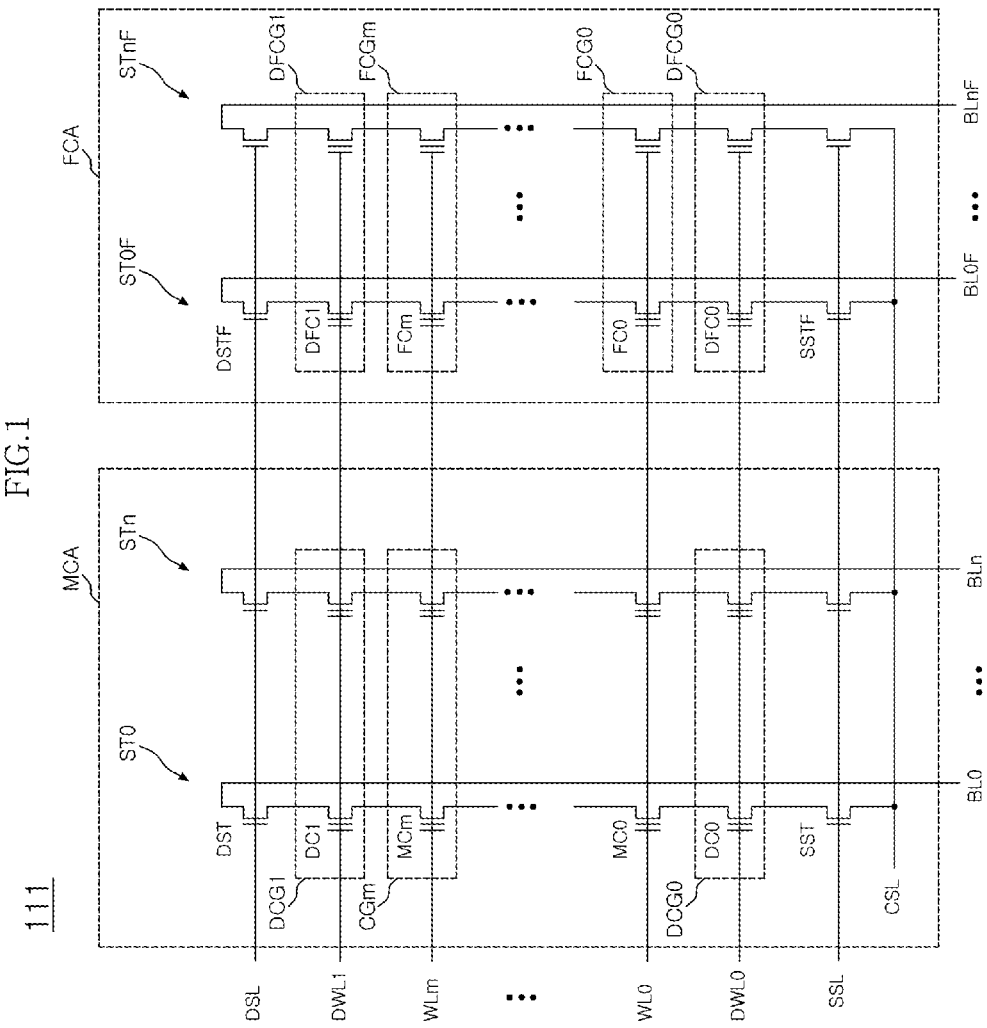
FIG. 1 is a circuit diagram exemplarily showing the memory block of a nonvolatile memory device in accordance with an embodiment of the present invention.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the is present invention.

As used herein, the term "and/or" includes any and all combinations of one or more of the associated listed items. It will be understood that when an element is referred to as being "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, integer, step, operation, element, and/or component, but do not preclude the presence or addition of one or more other features, integers, steps, operations, elements, components, and/or groups thereof.

Hereinafter, a nonvolatile memory device and a method for operating the same according to the present invention will be described below with reference to the accompanying drawings through exemplary embodiments.

The memory cell of a flash memory device is aged by erase and write operations. The aged memory cell, that is, the worn memory cell may cause a defect (for example, a physical defect). In order to prevent a certain block of the flash memory device from being worn faster than the other blocks, a flash translation layer manages a wear level so as to evenly distribute the memory cells in is terms of the erase and write cycles. In order to manage the wear level of the flash memory device, the erase count of each block of the flash memory device may be referred to. Hereafter, a method for storing and managing such an erase count will be described in detail with reference to the drawings.

Figure 2:
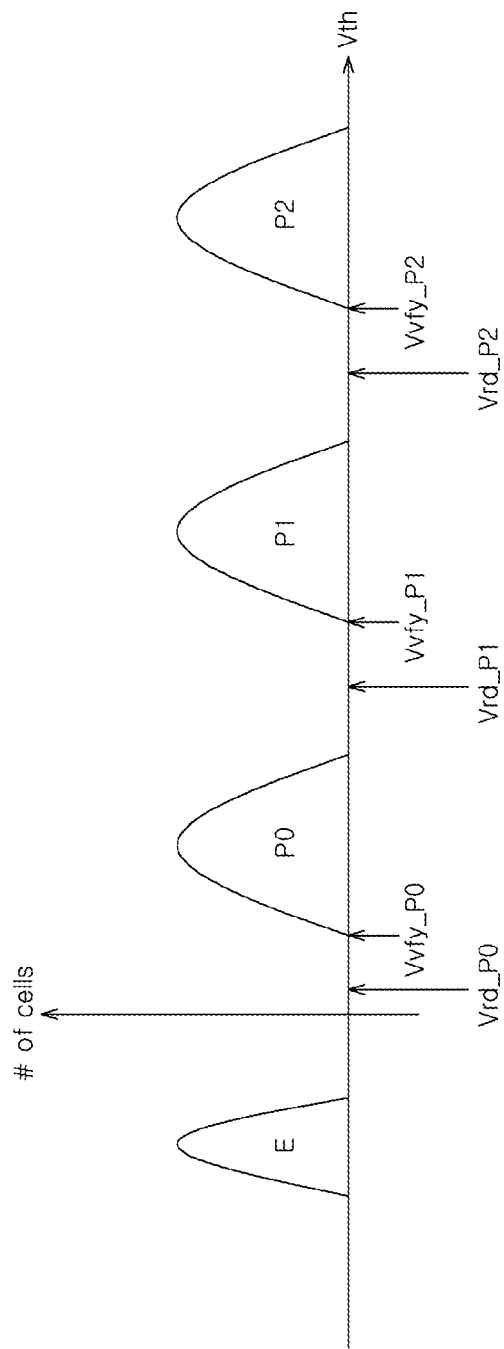
FIG. 2 is a graph exemplarily showing the threshold voltage distributions of the memory cells of the nonvolatile memory device in accordance with an embodiment of the present invention.

FIG. 1 is a circuit diagram exemplarily showing the memory block of a nonvolatile memory device in accordance with an embodiment of the present invention. FIG. 2 is a graph showing the threshold voltage distributions of the memory cells of the nonvolatile memory device in accordance with an embodiment of the present invention. Referring to FIG. 1, for the sake of simplified explanation, one memory block 111 included in the memory cell array of a nonvolatile memory device is exemplarily illustrated.

The memory block 111 includes a main cell area MCA and a flag cell area FCA. The main cell area MCA is an area for storing the data provided from the outside of the nonvolatile memory device. Although not shown in the figure, the main cell area MCA may include a main area and a spare area. The user data provided from the outside of the nonvolatile memory device is stored in the main area. The information associated with the user data stored in the main area, for example, meta-data such as an error correction code, is stored in the spare area.

The main cell area MCA includes a plurality of cell strings ST0 to STn which are connected to a plurality of bit lines BL0 to BLn. The cell strings ST0 to STn have the same circuit configuration, and for the sake of convenience in explanation, one cell string ST0 will be described.

The cell string ST0 includes a plurality of memory cells MC0 to MCm and select transistors DST and SST which are connected between the bit line BL0 and a common source line CSL. For example, the cell string ST0 includes the drain select transistor DST which is connected to a drain select line DSL, the plurality of memory cells MC0 to MCm which are respectively connected to a plurality of word lines WL0 to WLm, and the source select transistor SST which is connected to a source select line SSL.

A dummy memory cell DC0 is connected between the source select transistor SST and the memory cell MC0. A dummy memory cell DC1 is connected between the drain select transistor DST and the memory cell MCm. Dummy word lines DWL0 and DWL1 are respectively connected to the gates of the dummy memory cells DC0 and DC1. The dummy memory cells DC0 and DC1 have the same structure as the memory cells MC0 to MCm. While two dummy word lines DWL0 and DWL1 are exemplarily illustrated in an embodiment of the present invention, it can be understood that one dummy word line or a plurality of dummy word lines may be connected to the cell string ST0.

Unlike the memory cells, the dummy memory cells DC0 and DC1 are not used as storage devices for storing the user data provided from the outside of the nonvolatile memory device. The dummy memory cells DC0 and DC1 and the dummy memory cells of the cell string STn are respectively included in dummy memory cell groups DCG0 and DCG1. In the same manner, it may be understood that the dummy memory cells included in the dummy memory cell groups DCG0 and DCG1 are also not used as storage devices for storing user data. That is, the dummy memory cell groups DCG0 and DCG1 are hidden areas which cannot be accessed by a user. According to an embodiment of the present invention, the erase count of the memory block 111 is stored in at least one of the dummy memory cell groups DCG0 and DCG1. In an embodiment of the present invention, the erase count means the number of times a memory block (for example, a memory block 111) is erased. The value of the erase count is increased each time the memory block (for example, the memory block 111) is erased.

The flag cell area FCA has the same structure as the main cell area MCA. Therefore, detailed description thereof will be omitted herein. The flag cell area FCA is used as a storage device for storing whether or not any one of the memory cells of the corresponding main cell area MCA is programmed in the most significant bit (MSB) thereof. Accordingly, unlike the main cell area MCA for storing user data, the flag cell area FCA is a hidden area which cannot be accessed by the user. For the sake of simplified explanation, a main cell group CGm of the main cell area MCA and a corresponding flag cell group FCGm will be exemplarily described below in detail.

Each of the memory cells of the main cell group CGm may store a plurality of data bits (for example, data of 2 or more bits). Such a memory cell is called a multi-level cell (MLC). For instance, referring to FIG. 2, the multi-level cell (MLC) may be programmed to have a threshold voltage corresponding to any one of an erased state E and a plurality of programmed states P0, P1 and P2, depending upon multi-bit data. In the case where the multi-level cell stores 2-bit data as shown in FIG. 2, an upper bit (hereinafter, referred to as an 'MSB') and a lower bit (hereinafter, referred to as an 'LSB') are programmed. In the case where the MSB is programmed, a corresponding flag cell is programmed, and a read operation may be simplified by referring to the programmed flag cell.

For example, if any one of the memory cells of the main cell group CGm is MSB-programmed, all of the flag cells of the corresponding flag cell group FCGm are programmed. At this time, the flag cells of the flag cell group FCGm store at least one bit. In other words, each of the flag cells of the flag cell group FCGm is a single level cell (SLC). Depending upon the data stored in the flag cells of the flag cell group FCGm, whether or not the memory cells of the corresponding main cell group CGm are MSB-programmed may be determined.

The data stored in the flag cells of the flag cell group FCGm may be changed due to some reasons. Thus, the flag cells of the flag cell group FCGm are read through error detection. As such an error detection method, a majority check method may be used. For example, through the majority check method, majority data among the data stored in the flag cells of the flag cell group FCGm may be determined as the data stored in the flag cells. It can be understood that such a majority check method may be adopted in the case where the data of all the flag cells included in the flag cell area FCA are read out.

Similar to the main cell area MCA, the flag cell area FCA includes the dummy flag cells connected to the dummy word lines DWL0 and DWL1 (that is, the dummy flag cells included in dummy flag cell groups DFCG0 and DFCG1). These dummy flag cells have the same structure as those of the flag cell groups FCG0 to FCGm.

Unlike the flag cells included in the flag cell groups FCG0 to FCGm, the dummy flag cells included in the dummy flag cell groups DFCG0 and DFCG1 are not used as storage devices for storing whether or not the MSB is programmed. According to an embodiment of the present invention, the erase count of the memory block 111 is stored in at least one of the dummy flag cell groups DFCG0 and DFCG1. It can be readily understood that the majority check method may be applied in the case of reading out the erase count stored in the dummy flag cell groups DFCG0 and DFCG1.

Figure 3:
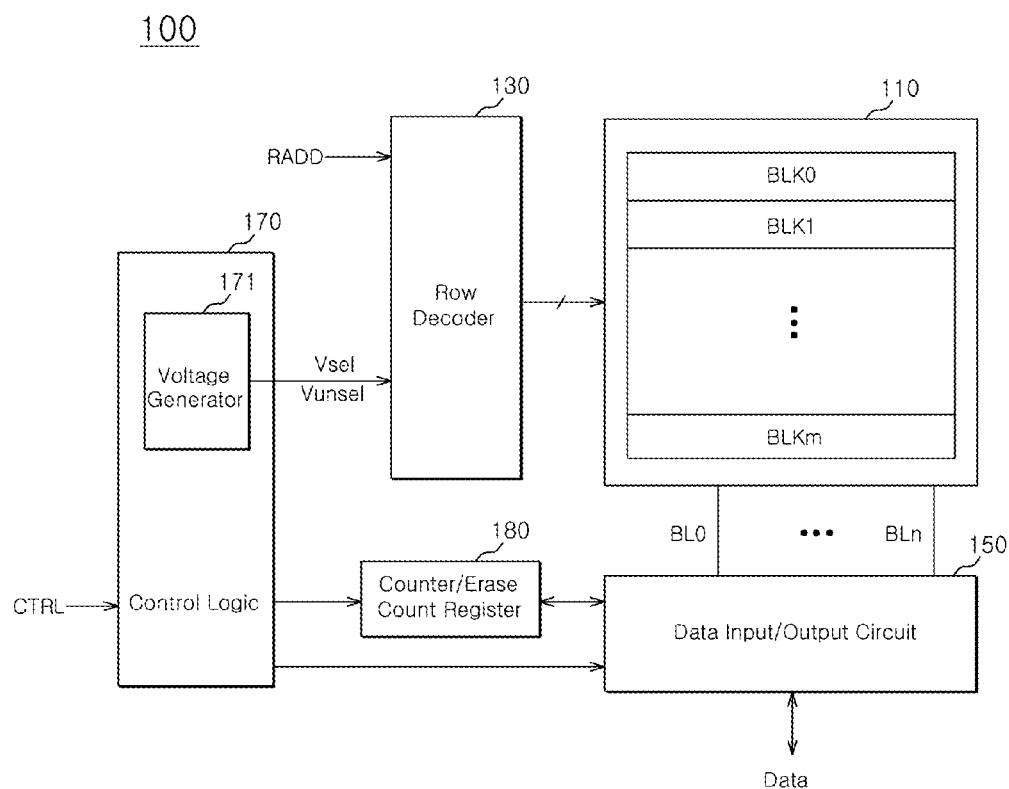
FIG. 3 is a block diagram exemplifying the nonvolatile memory device in accordance with an embodiment of the present to invention.

FIG. 3 is a block diagram exemplifying the nonvolatile memory device in accordance with an embodiment of the present invention. Referring to FIG. 3, the nonvolatile memory device 100 includes a memory cell array 110, a row decoder 130, a data input/output circuit 150, a control logic 170, and a counter/erase count register 180.

The memory cell array 110 includes a plurality of memory blocks BLK0 to BLKm. Each of the plurality of memory blocks BLK0 to BLKm has the same configuration as the memory block 111 described above with reference to FIG. 1.

The row decoder 130 is configured to select word lines (WL0 to WLm in FIG. 1) in response to a row address RADD. The row decoder 130 transmits various word line voltages provided from a voltage generator 171 to selected word lines and unselected word lines.

The data input/output circuit 150 is configured to operate under the control of the control logic 170. The data input/output circuit 150 operates as a write driver or a sense amplifier depending upon an operation mode. For example, the data input/output circuit 150 stores the data inputted through a data input/output buffer (not shown) to a memory cell of the memory cell array 110 in a program operation. In another example, the data input/output circuit 150 outputs the data read from a cell of the memory cell array 110 through a data input/output buffer (not shown) in a read operation. In still another example, the data input/output circuit 150 provides the data read out from dummy memory cell groups (see DCG0 and DCG1 in FIG. 1) or dummy flag cell groups (DFCG0 and DFCG1 in FIG. 1) of the memory cell array 110, to the counter/erase count register 180. In further still another example, the data input/output circuit 150 stores the erase count inputted from the counter/erase count register 180, to the dummy memory cell groups (see DCG0 and DCG1 in FIG. 1) or the dummy flag cell groups (DFCG0 and DFCG1 in FIG. 1) of the memory cell array 110.

The control logic 170 is configured to control general operations of the nonvolatile memory device 100 in response to a control signal CTRL provided from an external device (for example, a memory controller, a memory interface or a host device). For example, the control logic 170 controls the read, program (or write) and erase operations of the nonvolatile memory device 100. For such an operation, the control logic 170 controls the voltage generator 171 and the data input/output circuit 150.

According to an embodiment of the present invention, the control logic 170 manages the erase count of a memory block which is to be erased in an erase operation. For example, the control logic 170 controls a series of operations of reading out the erase count of the memory block to be erased, increasing the read-out erase count, and storing the increased erase count to the memory block. These erase count managing operations will be described below in detail with reference to FIG. 4.

The counter/erase count register 180 is configured to is operate under the control of the control logic 170. The counter/erase count register 180 increases the erase count provided from the data input/output circuit 150. The counter/erase count register 180 temporarily stores the increased erase count. The counter/erase count register 180 provides the increased erase count to the data input/output circuit 150. Although the counter/erase count register 180 separated from the control logic 170 is illustrated in the embodiment of the present invention, it is to be appreciated that the counter/erase count register 180 may be included in the control logic 170. For example, it can be understood that the counter/erase count register 180 may be constituted by any one of a plurality of registers included in the control logic 170 to temporarily store a command, a status data, etc.

Figure 4:
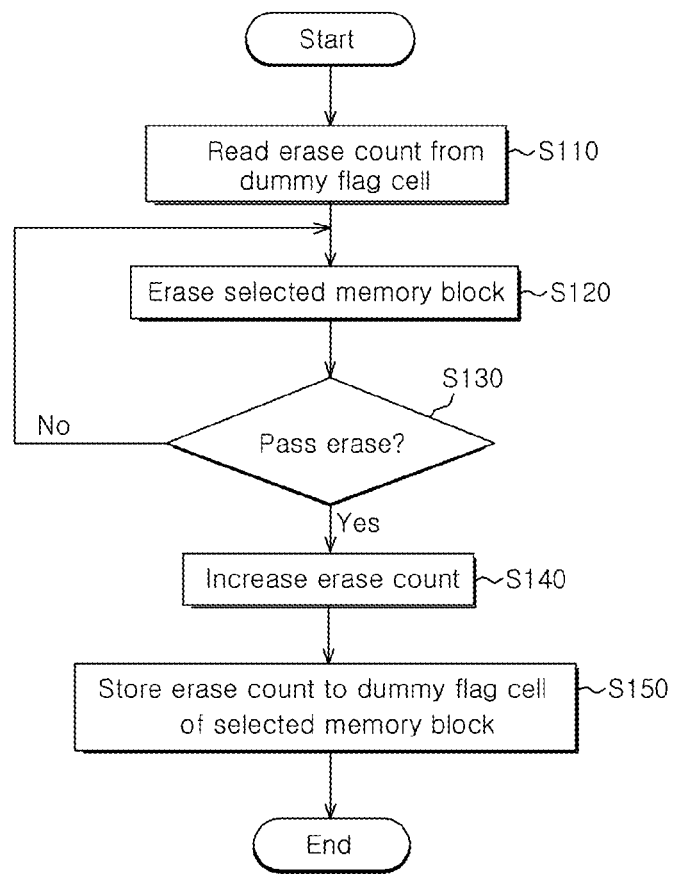
FIG. 4 is a flow chart exemplifying an erase method of a nonvolatile memory device in accordance with an embodiment of the present invention.

FIG. 4 is a flow chart exemplifying an erase method of a nonvolatile memory device in accordance with an embodiment of the present invention. An exemplary embodiment of the erase method of a nonvolatile memory device will be described below in detail with reference to FIGS. 1, 3 and 4.

In step S110, an erase count is read out from a dummy flag cell of a selected memory block. That is, an erase count is read out from the dummy flag cell group (DFCG0 or DFCG1 in FIG. 1) of the selected memory block. In this case, the erase count is read out through majority check method. In another example, an erase count may be read out from the dummy memory cell group (DCG0 or DCG1 is in FIG. 1) of the selected memory block. The read-out erase count is temporarily stored in the counter/erase count register 180.

In step S120, after the erase count of the selected memory block is read out, the selected memory block is erased. Then, in step S130, whether or not the selected memory block is erased is determined. In the case where the selected memory block is not erased, the procedure proceeds to the step S120, and the erase operation is repeated until the selected memory block is erased. When it is determined that the selected memory block is erased, the procedure proceeds to step S140.

In the step S140, the erase count stored in the counter/erase count register 180 is increased. Next, in step S150, the increased erase count is stored in the dummy flag cell group (DFCG0 or DFCG1 in FIG. 1) of the selected memory block. In another example, the increased erase count may be stored in the dummy memory cell group (DCG0 or DCG1 in FIG. 1) of the selected memory block.

Through the erase operation described in the steps S110 to S150, the erase count of each of the memory blocks of the nonvolatile memory device may be stored and managed in the nonvolatile memory device.

Figure 5:
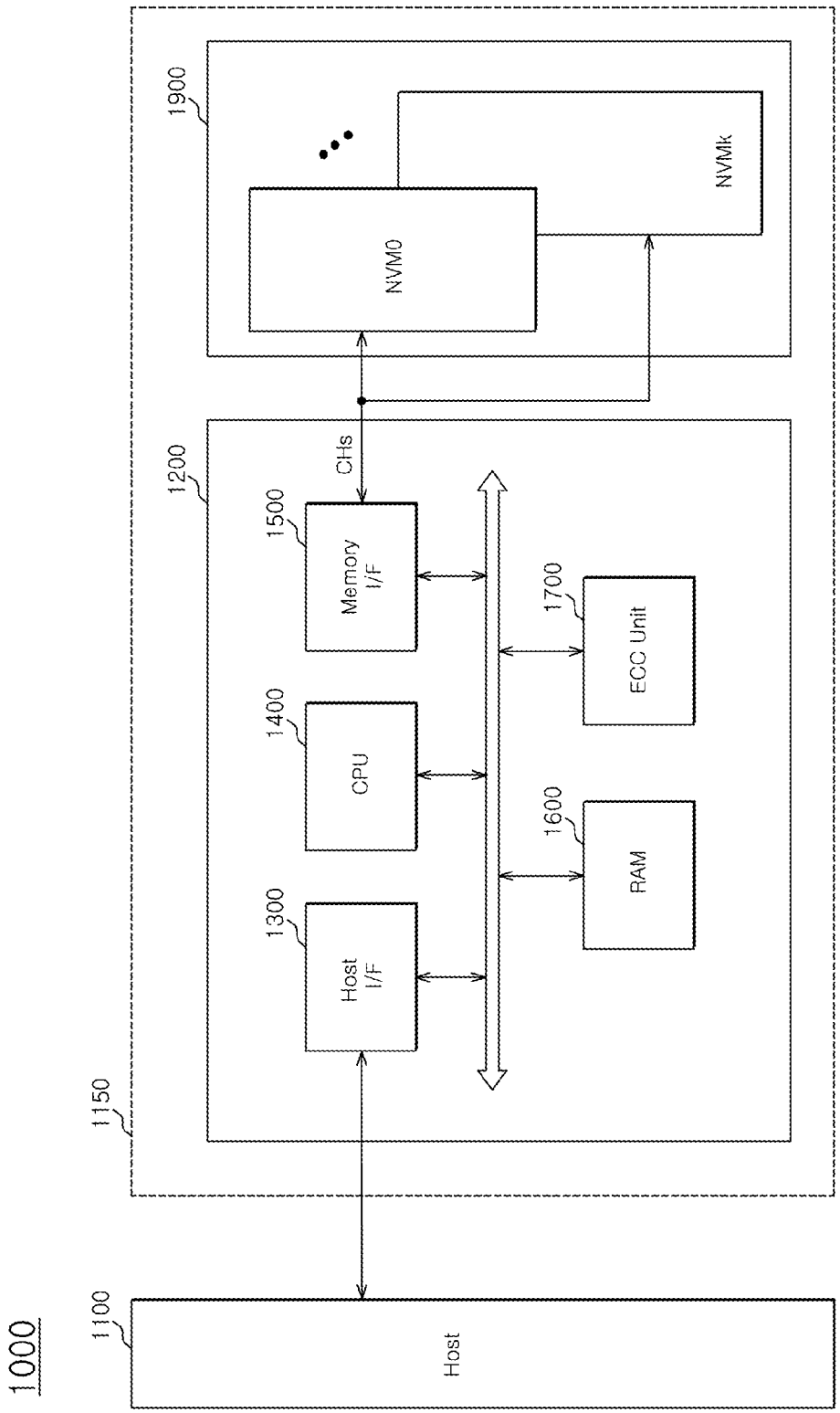
FIG. 5 is a block diagram exemplifying a data processing is system including the nonvolatile memory device in accordance with an embodiment of the present invention.

FIG. 5 is a block diagram exemplifying a data processing system including the nonvolatile memory device in accordance with an embodiment of the present invention. Referring to FIG. 5, a data processing system 1000 includes a host device 1100 and a data storage device 1150. The data storage device 1150 includes a controller 1200 and a data storage medium 1900. The data storage device 1150 may include the data storage medium 1900 which is constituted by a plurality of data storage media NVM0 to NVMk. In an embodiment of the present invention, a nonvolatile memory device (see the reference numeral 100 in FIG. 3) will be used as an exemplary data storage medium 1900 for explaining the characteristics and functions of the present invention.

The controller 1200 is connected to the host device 1100 and the nonvolatile memory device 1900. The controller 1200 is configured to access the nonvolatile memory device 1900 in response to a request from the host device 1100. For example, the controller 1200 is configured to control read, program and erase operations for the nonvolatile memory device 1900. The controller 1200 is configured to provide an interface between the host device 1100 and the nonvolatile memory device 1900. The controller 1200 is configured to drive a firmware for controlling the nonvolatile memory device 1900. Such a firmware is loaded on a RAM 1600 and is driven by a central processing unit 1400.

The nonvolatile memory device 1900 cannot perform overwrite of data due to a structure characteristic. For this reason, in order to program data to the memory cell of the nonvolatile memory device 1900, an erase operation should be preceded. Due to this fact, not only it is difficult to use the data storage device 1150 as a main memory device, but also, even when the data storage device 1150 is used as an auxiliary memory device, it is difficult to apply the file system used in the data processing system 1000 as it is. Therefore, in order to hide the erase operation of the nonvolatile memory device 1900, a firmware (or a software) called a flash translation layer (FTL) is used between the file system and the nonvolatile memory device 1900.

The flash translation layer may include functions such as mapping information administration for matching the logic address of the file system to the physical address of the nonvolatile memory device 1900, bad block administration of a flash memory device, data integrity administration for preparation against unpredicted power-off, and wear level administration of the block of a flash memory device.

The flash translation layer manages a wear level through a wear leveling technique such that any one page of the nonvolatile memory device 1900 is not concentrically programmed or any one block of a flash memory device is not concentrically erased. In an embodiment of the present invention, the flash translation layer is provided with an erase count to be used in the wear leveling technique, from the nonvolatile memory device 1900. That is, the central processing unit 1400 for driving the flash translation layer requests the erase count to the nonvolatile memory device 1900, and in response to this, the nonvolatile memory device 1900 reads the is erase count stored in a memory block and provides the erase count to the central processing unit 1400. An erase count providing method of the nonvolatile memory device 1900 will be described later in detail with reference to FIG. 6.

The controller 1200 may include component elements well known in the art, such as a host interface 1300, the central processing unit 1400, a memory interface 1500, the RAM 1600 and an error correction code unit 1700. The RAM 1600 may be used as a working memory of the central processing unit 1400. The central processing unit 1400 controls the general operations of the controller 1200.

The host interface 1300 may include a protocol for performing exchange of data between the host device 1100 and the controller 1200. For example, the host interface 1300 may be configured to communicate with the host device 1100 through one of various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, an SATA (serial ATA) protocol, an SCSI (small computer small interface) protocol and an IDE (integrated drive electronics) protocol.

The error correction code unit 1700 may be configured to detect and correct an error of data read from the nonvolatile memory device 1900. The memory interface 1500 may interface the nonvolatile memory device 1900 and the controller 1200.

The controller 1200 and the nonvolatile memory device 1900 may be integrated into one semiconductor device and may constitute a memory card. For example, the controller 1200 and the nonvolatile memory device 1900 may be integrated into one semiconductor device and may constitute a PCMCIA (personal computer memory card international association) card, a CF (compact flash) card, a smart media card, a memory stick, a multimedia card (MMC, RS-MMC, MMC-micro), an SD (secure digital) card (SD, Mini-SD, Micro-SD, SDHC), a UFS (universal flash storage) card, etc.

In another example, the controller 1200 or the nonvolatile memory device 1900 may be mounted to various types of packages. For example, the controller 1200 or the nonvolatile memory device 1900 may be packaged and mounted into a POP (package-on-package), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a thin quad flat package (TQFP), a small outline IC (SOIC), a shrink small outline package (SSOP), a thin small outline package (TSOP), a system in package (SIP), a multi-chip package (MCP 0), a wafer-level fabricated package (WFP), a wafer-level processed stack package (WSP), etc.

Figure 6:
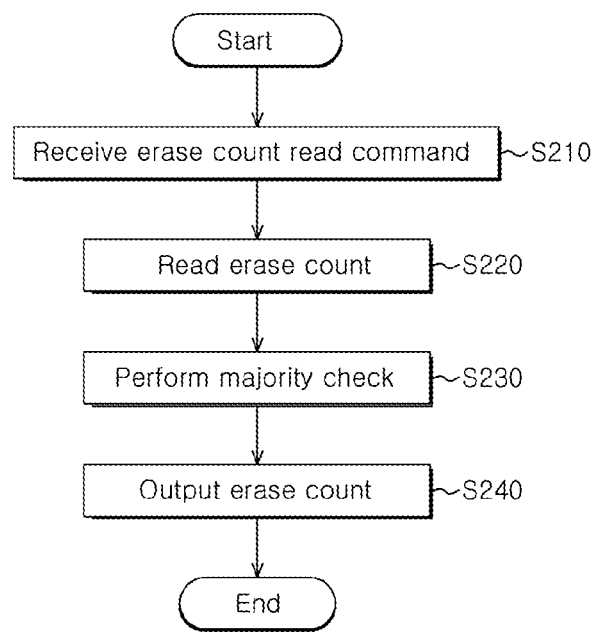
FIG. 6 is a flow chart exemplifying an erase count providing method of the nonvolatile memory device included in the data processing system of FIG. 5.

FIG. 6 is a flow chart exemplifying an erase count providing is method of the nonvolatile memory device included in the data processing system of FIG. 5. An exemplary embodiment of the erase count providing method of the nonvolatile memory device will be described below in detail with reference to FIGS. 5 and 6.

In step S210, the nonvolatile memory device 1900 receives an erase count read command from the controller 1200. In step S220, the nonvolatile memory device 1900 reads out the erase count stored in each of the memory blocks in response to the request from the controller 1200.

In the case where the erase count is stored in the dummy flag cell group (DFCG0 or DFCG1 in FIG. 1) of a memory block, the procedure proceeds to step S230. In the step S230, the nonvolatile memory device 1900 performs majority check for the erase count read out from the dummy flag cell group (DFCG0 or DFCG1 in FIG. 1). Then, in step S240, the nonvolatile memory device 1900 outputs the erase count for which the majority check is performed, to the controller 1200.

In the case where the erase count is stored in the dummy memory cell group (DCG0 or DCG1 in FIG. 1) of the memory block, the step S230 is omitted, and the procedure proceeds to the step S240. Accordingly, the nonvolatile memory device 1900 outputs the read-out erase count to the controller 1200.

According to the embodiments of the present invention, the resource overhead of a memory system including a nonvolatile is memory device which internally manages an erase count may be reduced.

While certain embodiments have been described above, it will be understood to those skilled in the art that the embodiments described are by way of example only. Accordingly, the nonvolatile memory device and the method for operating the same described herein should not be limited based on the described embodiments. Rather, the nonvolatile memory device and the method for operating the same described herein should only be limited in light of the claims that follow when taken in conjunction with the above description and accompanying drawings.

What is claimed is:

1. A method for operating a semiconductor memory device including a memory block-constituted by main memory cells and dummy memory cells, the method comprising:

reading out an erase count of the memory block stored in the dummy memory cells, erasing the memory block, increasing the read-out erase count, and storing the increased erase count in the dummy memory cells, wherein the dummy memory cells are connected to at least one dummy word line, wherein the main memory cells are divided into a main cell area and a flag cell area, wherein the dummy memory cells are divided into a dummy main cell area and a dummy flag cell area, wherein the erase count of the memory block is read out from the dummy flag cell area, and wherein the increased erase count is stored in the dummy flag cell area.

2. The method according to claim 1, wherein error check is performed for data which are read out from the flag cell area and the dummy flag cell area.

3. The method according to claim 2, wherein the error check includes majority check in which majority data among the read-out data are determined as effective data.

4. The method according to claim 2, wherein the erase count read out from the dummy flag cell area is provided to an external device in response to a request from the external device.

5. The method according to claim 1, wherein whether or not upper bits of the main memory cells are programmed is stored in the flag cell area of the main memory cells.

6. The method according to claim 1, wherein the dummy memory cells are hidden areas which cannot be accessed by a user.

7. A semiconductor memory device comprising:
a memory block including main memory cells and dummy memory cells; and
a control logic configured to control an erase operation of the memory block,
wherein the main memory cells are divided into a main cell area and a flag cell area,
wherein the dummy memory cells are divided into a dummy main cell area and a dummy flag cell area,
wherein the control logic reads out an erase count of the memory block stored in the dummy flag cell area, erases the memory block, increases the read-out erase count, and stores the increased erase count to the dummy flag cell area, and
wherein the dummy memory cells are connected to at least one dummy word line.

8. The semiconductor memory device according to claim 7, further comprising:
a data input/output circuit configured to store data in the main memory cells and the dummy memory cells and read out data from the main memory cells and the dummy memory cells;
a counter configured to increase the erase count; and
a register configured to temporarily store the increased erase count.

9. The semiconductor memory device according to claim 8, wherein the data input/output circuit reads out the erase count of the memory block from the dummy flag cell area under the control of the control logic and provides the read-out erase count to the counter.

10. The semiconductor memory device according to claim 9, wherein the data input/output circuit stores the increased erase count provided from the register, in the dummy flag cell area under the control of the control logic.

11. The semiconductor memory device according to claim 9, wherein the data input/output circuit stores whether or not upper bits of the main memory cells are programmed, to the flag cell area of the main memory cells under the control of the control logic.

12. The semiconductor memory device according to claim 7, wherein the dummy memory cells are hidden areas which cannot be accessed by a user.

13. A system comprising:
a memory block including main memory cells and dummy memory cells; and
a control logic configured to control an erase operation of the memory block,
wherein the main memory cells are divided into a main cell area and a flag cell area,
wherein the dummy memory cells are divided into a dummy main cell area and a dummy flag cell area,
wherein the control logic reads out an erase count of the memory block stored in the dummy flag cell area, erases the memory block, increases the read-out erase count, and stores the increased erase count to the dummy flag cell area, and
wherein the dummy memory cells are connected to at least one dummy word line.

14. The system according to claim 13, further comprising:
a data input/output circuit configured to store data in the main memory cells and the dummy memory cells and read out data from the main memory cells and the dummy memory cells;
a counter configured to increase the erase count; and
a register configured to temporarily store the increased erase count.

15. The system according to claim 14,
wherein the data input/output circuit reads out the erase count of the memory block from the dummy flag cell area under the control of the control logic and provides the read-out erase count to the counter.

16. The system according to claim 15, wherein the data input/output circuit stores the increased erase count provided from the register, in the dummy flag cell area under the control of the control logic.

* * * * *